United States Patent
Chi

(10) Patent No.: US 9,648,427 B2
(45) Date of Patent: May 9, 2017

(54) MEMS MICROPHONE

(71) Applicant: Sijie Chi, Shenzhen (CN)

(72) Inventor: Sijie Chi, Shenzhen (CN)

(73) Assignee: AAC TECHNOLOGIES PTE. LTD., Singapore (SG)

( * ) Notice: Subject to any disclaimer, the term of this patent is extended or adjusted under 35 U.S.C. 154(b) by 0 days.

(21) Appl. No.: 14/979,424

(22) Filed: Dec. 27, 2015

(65) Prior Publication Data

US 2016/0219377 A1  Jul. 28, 2016

(30) Foreign Application Priority Data

Jan. 26, 2015 (CN) .......................... 2015 2 0051073

(51) Int. Cl.
*H04R 25/00* (2006.01)
*H04R 19/04* (2006.01)
*H04R 19/00* (2006.01)

(52) U.S. Cl.
CPC ............ *H04R 19/04* (2013.01); *H04R 19/005* (2013.01); *H04R 2201/003* (2013.01); *H04R 2499/11* (2013.01)

(58) Field of Classification Search
CPC  H04R 19/04; H04R 19/005; H04R 2231/001; H04R 2499/11

USPC .......................................... 381/174, 175, 314
See application file for complete search history.

(56) References Cited

U.S. PATENT DOCUMENTS

| | | | | |
|---|---|---|---|---|
| 2010/0284553 A1* | 11/2010 | Conti | .................... | B81B 7/0061 381/174 |
| 2014/0064546 A1* | 3/2014 | Szczech | .................. | H04R 1/04 381/361 |
| 2016/0167947 A1* | 6/2016 | Hoegerl | ................. | H04R 19/04 257/416 |

* cited by examiner

*Primary Examiner* — Brian Ensey
(74) *Attorney, Agent, or Firm* — Na Xu; IPro, PLLC

(57) ABSTRACT

The present disclosure discloses a MEMS microphone including a MEMS chip, an ASIC chip and an injection molding package. The MEMS chip is stacked on and connected to the ASIC chip by a TSV connector. The MEMS chip comprises a substrate having a cavity, a back plate and a diaphragm for forming a capacitor structure. The cavity is divided by the capacitor structure into a rear acoustic cavity facing the ASIC chip and the front acoustic cavity opposite to the rear acoustic cavity. The size of the MEMS microphone is reduced effectively, as the MEMS chip is stacked on the ASIC chip and connected each other by a TSV connector.

5 Claims, 3 Drawing Sheets

MEMS MICROPHONE

FIELD OF THE INVENTION

The present invention relates to a miniature microphone, specifically to a capacitive MEMS (micro-electro-mechanical systems) microphone applied in electronic devices.

DESCRIPTION OF RELATED ART

With the development of wireless communication technology, there are more and more mobile phone users in the world. Mobile phone users are no longer satisfied on the call function of the phone, they require higher call quality. Especially in the current development of mobile multimedia technology, mobile phone call quality is more important. As the microphone of mobile phone is a voice pickup device on mobile phone, its design has a direct effect on call quality.

A typical MEMS microphone generally includes a housing, a control circuit board mounted inside the housing, a MEMS chip and an ASIC chip. The MEMS chip and ASIC chip are mounted respectively on the control circuit board. Such MEMS microphone package structure requires a large space, and therefore cannot meet the requirement of the market on the encapsulating size and encapsulating cost.

Therefore, it is necessary to provide an improved MEMS microphone to solve above problems.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION OF THE EXEMPLARY EMBODIMENTS

The present invention will hereinafter be described in detail with reference to exemplary embodiments.

A MEMS microphone of the present disclosure is mainly used in mobile terminals for receiving sound and converting the sound into electrical signals. The present disclosure adopts a stack mounting structure. A MEMS chip is stacked directly on an ASIC chip. The direct injection molding package encapsulates the outer periphery of MEMS chip and ASIC chip, so as to reduce the size of MEMS microphone and increase the integration level.

Figure 1:
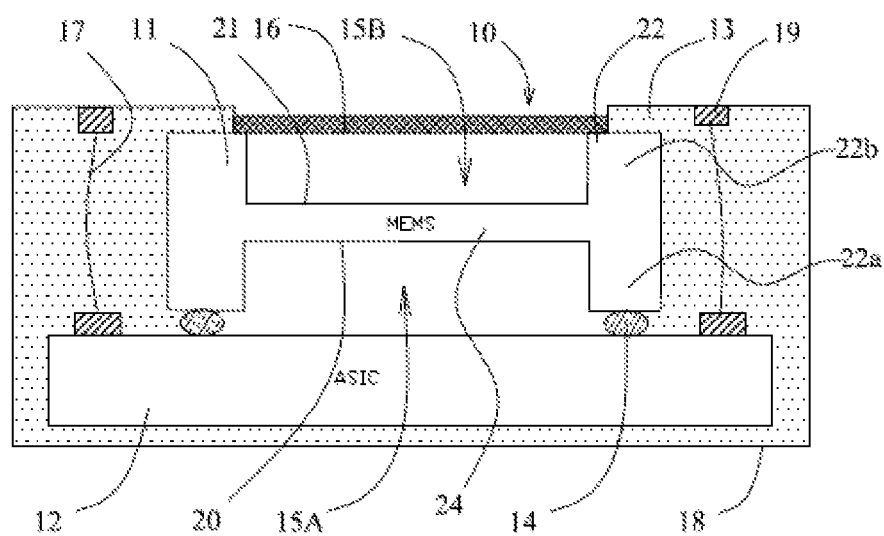
FIG. 1 is a cross-sectional view of a MEMS microphone in accordance with a first embodiment of the present disclosure.

As shown in FIG. 1, a MEMS microphone of the present disclosure in accordance with a first exemplary embodiment includes an ASIC chip 12, a MEMS chip 11 which is stacked on the ASIC chip 12, and an injection molding package 13 in which the MEMS chip 11 and the ASIC chip 12 are encapsulated. The MEMS chip 11 and the ASIC chip 12 are connected each other by a connector 14. The connector 14 is a structural part to connect the MEMS chip 11 and the ASIC chip 12 with TSV (Through Silicon Via) encapsulation technology.

Further, the MEMS chip 11 comprises a substrate 22 having a cavity, a back plate 20 and a diaphragm 21 which are installed in the cavity. The diaphragm 21 and the back plate 20 are located opposite to each other. The back plate 20 and the diaphragm 21 are provided respectively with conductive layers which can be powered up. However, the layers powered up are insulated from each other. In this way, the diaphragm 21 and the back plate 20 form a capacitor structure 24. Accordingly, the cavity is divided by the capacitor structure 24 formed by the back plate 20 and the diaphragm 21 into a rear acoustic cavity 15A facing the ASIC chip 12 and a front acoustic cavity 15B opposite to the rear acoustic cavity 15A. In the embodiment shown in FIG. 1, the back plate 20 is located near one side of the ASIC chip 12. The diaphragm 21 is located one side far from the ASIC chip 12. The back plate 20 and the substrate 22 are formed as the rear acoustic cavity 15A toward the ASIC chip 12. The diaphragm 21 and the substrate 22 form the front acoustic cavity 15B departing from ASIC chip 12. The front acoustic cavity 15B and the rear acoustic cavity 15A are separated by the diaphragm 21 and the back plate 20. It is optional here that the back plate 20 may be installed at one side far from the ASIC chip 12 and the diaphragm 20 is installed at one side close with the ASIC chip 12. In this case, the back plate 20 and a part 22b of the substrate 22 form the front acoustic cavity 15B. The diaphragm 20 and another part 22a of the substrate 22 form the rear acoustic cavity 15A.

Figure 2:
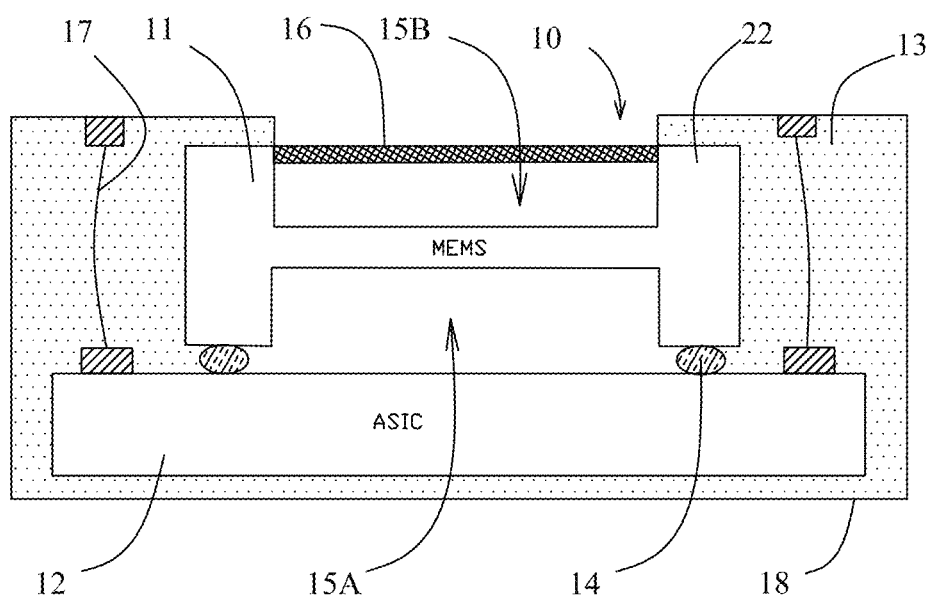
FIG. 2 is a cross-sectional view of a MEMS microphone in accordance with a second embodiment of the present disclosure.

The peripheral areas of the MEMS chip 11 and the ASIC chip 12 are encapsulated in the injection molding package 13. The MEMS chip 11 and the ASIC chip 12 are packed in the package 13. A sound hole 10 is provided above the MEMS chip 11 at a position corresponding to the front acoustic cavity 15B and is communicated with the front acoustic cavity 15B. The front acoustic cavity 15B is covered by a steel mesh or other metal mesh serving as a separation net 16. Thus the diaphragm 21 is protected and the sound introducing to the diaphragm 21 is not affected. The separation net 16 is optionally mounted inside the sound hole and abuts against the MEMS chip 11. In the second optional embodiment shown in FIG. 2, the separation net 16 may be installed inside the front acoustic cavity 15B, especially, at the top of the front acoustic cavity 15B to cover the opening of the front acoustic cavity 15B.

The package 13 is provided with a soldering pan 19 on a surface thereof, as shown in FIG. 1. The soldering pad 19 is embedded in an external surface of the package 13 and is electrically connected to the ASIC chip 12 by a gold wire 17. The signal of the ASIC chip can be transmitted outside MEMS microphone. The gold wire 17 may be replaced by a conductive wire and conductive strip etc., and can be soldered directly to the ASIC chip 12.

The side of the package 13 near the ASIC chip 12 is the mounting side 18. It can be seen from FIG. 1 that one end of the gold wire 17 is connected to the ASIC chip 12 and the other end is connected to the soldering pad 19 installed on the external surface of the package 13 opposite to the mounting side 18.

Figure 3:
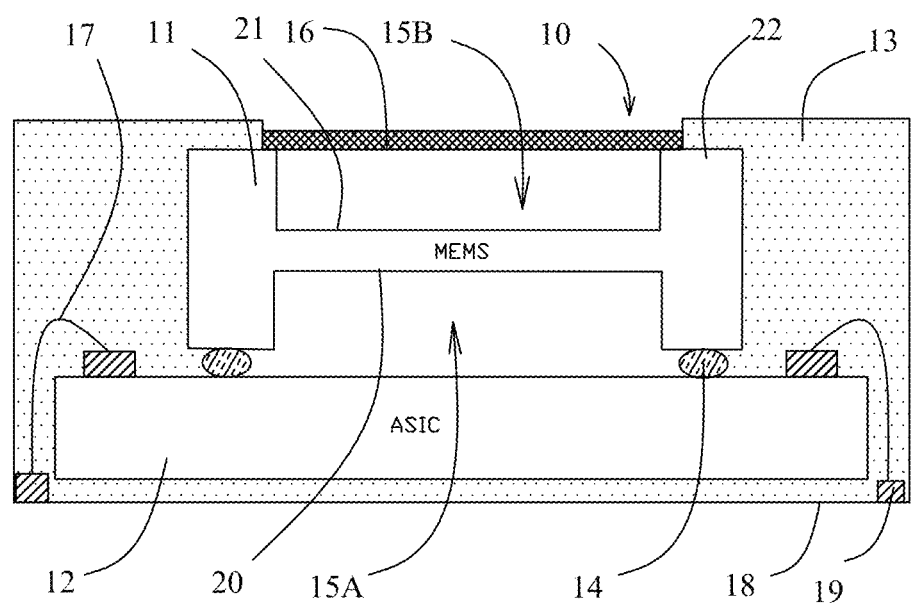
FIG. 3 is a cross-sectional view of a MEMS microphone in accordance with a third embodiment of the present disclosure.

Referring to FIG. 3, a MEMS microphone disclosed by a third optional embodiment of the present disclosure, compared with the embodiment shown in FIG. 1, has following differences: The soldering pad 19 is provided on the external surface of the mounting side 18. One end of the gold wire 17 is electrically connected to ASIC chip 12 and the other end of the gold wire 17 comes out from the mounting side 18 close to the ASIC chip 12.

The MEMS chip of the present disclosure forms directly the front acoustic cavity and the rear acoustic cavity separated by a sound transmission part. The MEMS chip is stacked directly on the ASIC chip and connected to the ASIC chip by a TSV connector. Such a structure can reduce effectively the size of MEMS microphone, and can increase the integration level of the MEMS microphone. In addition, the injection molding structure package encapsulating the MEMS chip and the ASIC chip can also reduce the difficulty degree of the encapsulating process.

It is to be understood, however, that even though numerous characteristics and advantages of the present embodiments have been set forth in the foregoing description, together with details of the structures and functions of the embodiment, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A MEMS microphone comprising:
   an ASIC chip;
   a MEMS chip located directly on the ASIC chip and electrically connected to the ASIC chip via a connector, the MEMS chip comprising a substrate having a cavity, a back plate and a diaphragm formed in the cavity for forming a capacitor structure;
   an injection molding package embedding the MEMS chip and the ASIC chip therein; wherein
   the cavity is divided by the capacitor structure into a rear acoustic cavity facing the ASIC chip and a front acoustic cavity opposite to the rear acoustic cavity, the rear acoustic;
   the rear acoustic cavity is formed by the capacitor structure and a part of the substrate, and the front acoustic cavity is formed by the capacitor structure and another part of the substrate:
   a separation net is located on the another part of the substrate and covering the front acoustic cavity.

2. The MEMS microphone as described in claim 1, wherein the package is provided with a sound hole communicated with the front vocal cavity.

3. The MEMS microphone as described in claim 2, wherein the separation net is mounted inside the sound hole and abuts against the MEMS chip.

4. The MEMS microphone as described in claim 3, wherein the package is provided with a soldering pan and the soldering pan is electrically connected to the ASIC chip by a gold wire.

5. The MEMS microphone as described in claim 4, wherein the soldering pan is placed close to the side of the package near the ASIC chip or the other side away from the ASIC chip.

\* \* \* \* \*